(12) United States Patent
Ragupathi et al.

(10) Patent No.: US 9,743,552 B2
(45) Date of Patent: *Aug. 22, 2017

(54) REGULATION OF AIRFLOW AND PERFORMANCE IN INFORMATION HANDLING SYSTEMS AFTER FAN FAILURE

(71) Applicant: Dell Products L.P., Round Rock, TX (US)

(72) Inventors: Dinesh Kunnathur Ragupathi, Round Rock, TX (US); Hasnain Shabbir, Round Rock, TX (US)

(73) Assignee: Dell Products L.P., Round Rock, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 15/342,593

(22) Filed: Nov. 3, 2016

(65) Prior Publication Data

US 2017/0079160 A1 Mar. 16, 2017

Related U.S. Application Data

(63) Continuation of application No. 14/575,845, filed on Dec. 18, 2014, now Pat. No. 9,521,780.

(51) Int. Cl.
*H05K 7/20* (2006.01)
*G05B 15/02* (2006.01)

(52) U.S. Cl.
CPC ......... *H05K 7/20209* (2013.01); *G05B 15/02* (2013.01); *H05K 7/20836* (2013.01)

(58) Field of Classification Search
CPC ............................ H05K 7/20209; G05B 15/02
See application file for complete search history.

(56) References Cited

U.S. PATENT DOCUMENTS

| | | | |
|---|---|---|---|
| 2004/0186629 A1* | 9/2004 | Frankel | G05D 23/1902 700/300 |
| 2011/0160916 A1* | 6/2011 | Bahali | G05D 23/1934 700/282 |
| 2012/0124590 A1* | 5/2012 | Balakrishnan | G06F 1/206 718/103 |

* cited by examiner

*Primary Examiner* — Kenneth M Lo
*Assistant Examiner* — David Wynne
(74) *Attorney, Agent, or Firm* — Baker Botts L.L.P.

(57) ABSTRACT

A fan control subsystem may control a plurality of fans in an information handling system to cool the information handling system. The fan control subsystem may determine a fan importance factor for each of the plurality of fans based on the presence and thermal priority ratings of one or more thermal components located in a respective thermal region associated with each of the plurality of fans. Upon detecting a failure of one of the plurality of fans, the fan control subsystem may regulate airflow within the information handling system based on the fan importance factors determined for the fans.

17 Claims, 7 Drawing Sheets

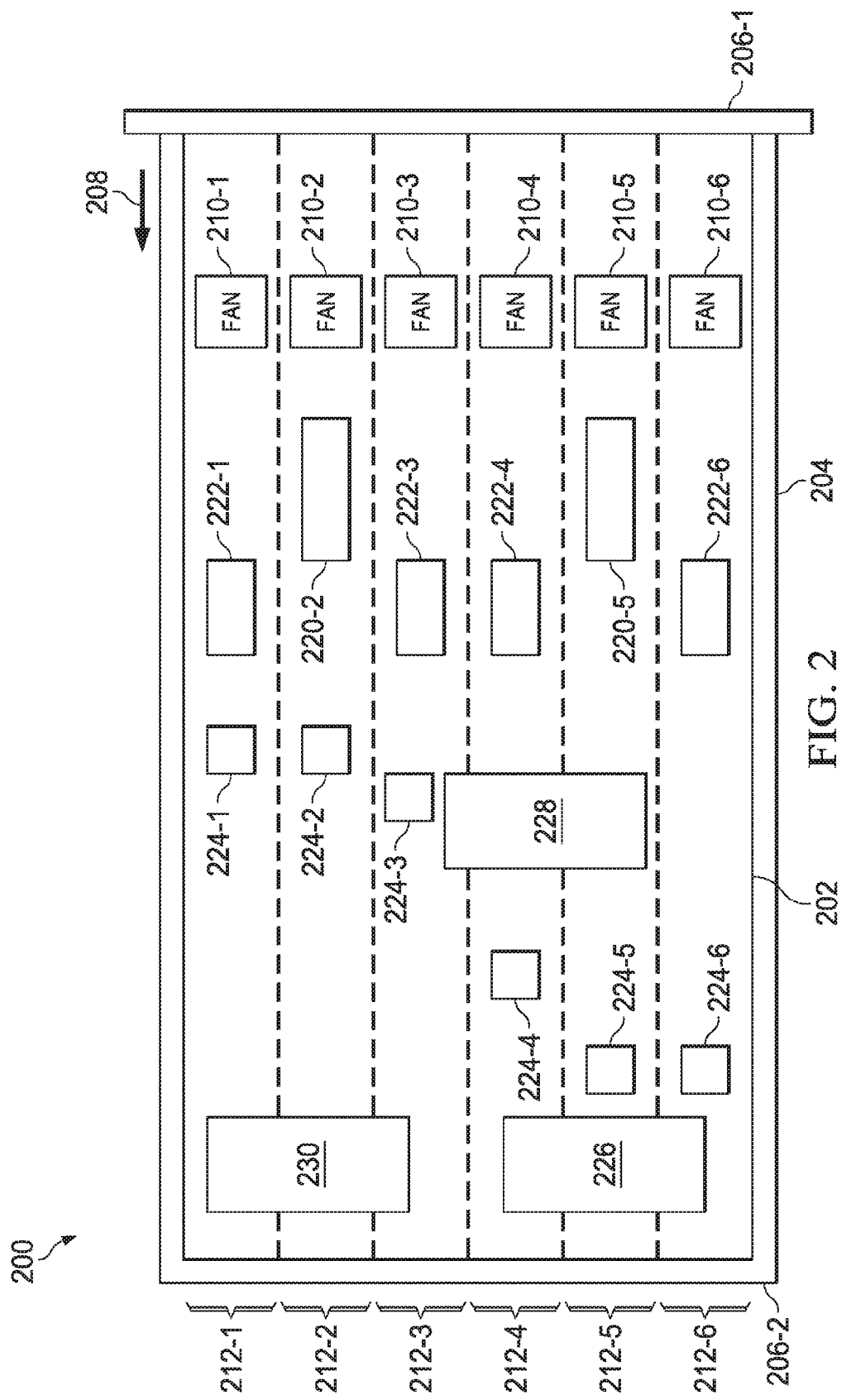

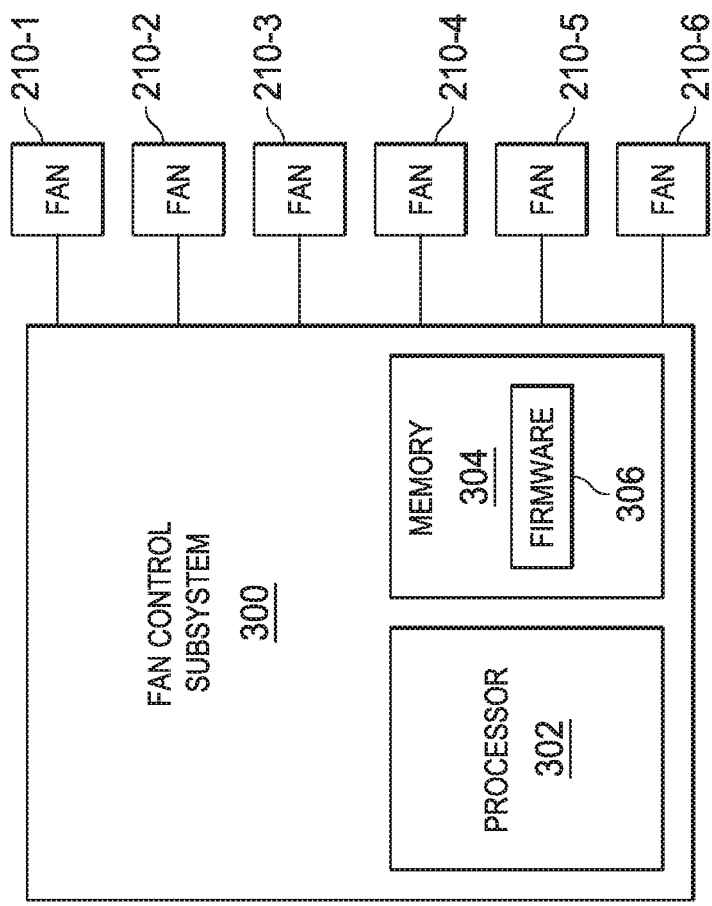

LOCATION TABLE 400

| THERMAL COMPONENTS | FANS | | | | | |
|---|---|---|---|---|---|---|
| | 210-1 | 210-2 | 210-3 | 210-4 | 210-5 | 210-6 |
| HIGH PRIORITY COMPONENTS | | | | | | |
| 220-2 | | X | | | | |
| 220-5 | | | | | X | |
| MEDIUM PRIORITY COMPONENTS | | | | | | |
| 222-1 | X | | | | | |
| 222-3 | | | X | | | |
| 222-4 | | | | X | | |
| 220-6 | | | | | | X |
| LOW PRIORITY COMPONENTS | | | | | | |
| 224-1 | X | | | | | |
| 224-2 | | X | | | | |
| 224-3 | | | X | | | |
| 224-4 | | | | X | | |
| 224-5 | | | | | X | |
| 224-6 | | | | | | X |
| DYNAMIC CARDS | | | | | | |
| SMALL DYNAMIC CARD 226 | | | | | X | X |
| MEDIUM DYNAMIC CARD 228 | | | X | X | X | |
| LARGE DYNAMIC CARD 230 | X | X | X | | | |

FIG. 4A

THERMAL PRIORITY RATINGS TABLE 410

| 414 THERMAL COMPONENTS | | THERMAL PRIORITY RATING 412 |
|---|---|---|
| | HIGH PRIORITY COMPONENTS | |
| | 220-2 | 9 |
| | 220-5 | 8 |
| | MEDIUM PRIORITY COMPONENTS | |
| | 222-1 | 6 |
| | 222-3 | 7 |
| | 222-4 | 5 |
| | 220-6 | 6 |
| | LOW PRIORITY COMPONENTS | |
| | 224-1 | 3 |
| | 224-2 | 4 |
| | 224-3 | 3 |
| | 224-4 | 1 |
| | 224-5 | 2 |
| | 224-6 | 4 |
| | DYNAMIC CARDS | |
| | SMALL DYNAMIC CARD 226 | 1 |
| | MEDIUM DYNAMIC CARD 228 | 1 |
| | LARGE DYNAMIC CARD 230 | 2 |

FIG. 4B

FAN IMPORTANCE FACTOR TABLE 420

| Thermal Components | | FANS | | | | | |
|---|---|---|---|---|---|---|---|
| | | 210-1 | 210-2 | 210-3 | 210-4 | 210-5 | 210-6 |
| HIGH PRIORITY COMPONENTS | | | | | | | |
| | 220-2 | | 9 | | | | |
| | 220-5 | | | | | 8 | |
| MEDIUM PRIORITY COMPONENTS | | | | | | | |
| | 222-1 | 6 | | | | | |
| | 222-3 | | | | 7 | | |
| | 222-4 | | | | | 5 | |
| | 220-6 | | | | | | 6 |
| LOW PRIORITY COMPONENTS | | | | | | | |
| | 224-1 | 3 | | | | | |
| | 224-2 | | 4 | | | | |
| | 224-3 | | | | 3 | | |
| | 224-4 | | | | | 1 | |
| | 224-5 | | | | | 2 | |
| | 224-6 | | | | | | 4 |
| DYNAMIC CARDS | | | | | | | |
| | SMALL DYNAMIC CARD 226 | | | | | 1 | 1 |
| | MEDIUM DYNAMIC CARD 228 | | | 1 | 1 | 1 | |
| | LARGE DYNAMIC CARD 230 | 2 | 2 | 2 | | | |
| FAN IMPORTANCE FACTORS (RAW) | | 11 | 15 | 13 | 7 | 12 | 11 |
| FAN IMPORTANCE FACTORS (NORMALIZED) | | 1.57 | 2.14 | 1.86 | 1.00 | 1.71 | 1.57 |
| RELATIVE IMPORTANCE RANKINGS | | 4 | 1 | 2 | 5 | 3 | 4 |

FIG. 4C

REGULATION OF AIRFLOW AND PERFORMANCE IN INFORMATION HANDLING SYSTEMS AFTER FAN FAILURE

RELATED APPLICATIONS

This application is a continuation of U.S. patent application Ser. No. 14/575,845 filed Dec. 18, 2014, the contents of which is incorporated by reference herein.

BACKGROUND

Field of the Disclosure

This disclosure relates generally to information handling systems and more particularly to regulating airflow and performance in an information handling system after fan failure.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may process, store, and communicate information and may include one or more computer systems, data storage systems, and networking systems.

In various information handling systems, the information handling system may cool or otherwise regulate a temperature of itself and its components. One or more fans may be used to help cool the information handling system by providing airflow to the information handling system and the components therein.

SUMMARY

In one aspect, a disclosed method for regulating airflow in an information handling system may involve determining fan importance factors of a first and a second fan respectively associated with a first and a second thermal region of an information handling system. The fan importance factors may be based on a presence and on a thermal priority rating of a first and a second thermal component in the respective thermal regions. The method may further include detecting a failure of the first fan by the fan control subsystem. In response to detecting the failure of the first fan, the method may further include regulating airflow in the information handling system based on the first and/or the second fan importance factors.

Other disclosed aspects include an article of manufacture including a machine-readable medium having instructions that, when read by a processor, cause the processor to determine a first and a second fan importance factor for first and second fans, respectively, in an information handling system. The instructions may then cause the processor to detect a failure of the first fan, and, in response to detecting the failure, to regulate airflow in the information handling system based on the first and/or the second fan importance factors. Other disclosed aspects include an information handling system that regulates its own airflow using systems and methods described herein.

BRIEF DESCRIPTION OF THE DRAWINGS

For a more complete understanding of the present invention and its features and advantages, reference is now made to the following description, taken in conjunction with the accompanying drawings, in which:

FIG. 2 is a block diagram of selected elements of an embodiment of an information handling system cooled by a plurality of fans;

FIG. 3 is a block diagram of selected elements of an embodiment of a fan control subsystem communicatively coupled with a plurality of fans;

FIG. 4A is a table representative of exemplary information that may be used by a fan control subsystem to determine fan importance factors of a plurality of fans;

FIG. 4B is a table representative of exemplary information that may be used by a fan control subsystem to determine fan importance factors of a plurality of fans;

FIG. 4C is a table representative of exemplary information that may be used by a fan control subsystem to determine fan importance factors of a plurality of fans.

DESCRIPTION OF PARTICULAR EMBODIMENT(S)

Figure 1:
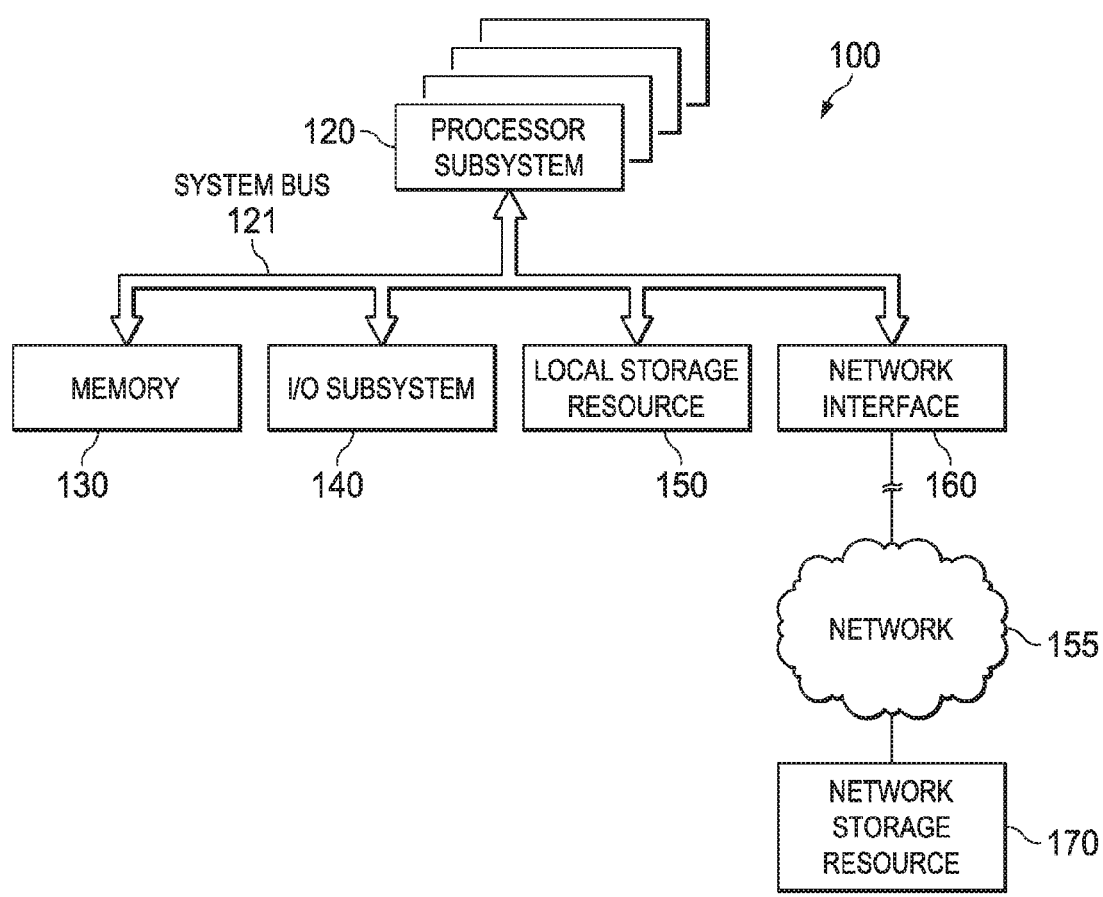
FIG. 1 is a block diagram of selected elements of an embodiment of an information handling system.

In the following description, details are set forth by way of example to facilitate discussion of the disclosed subject matter. It should be apparent to a person of ordinary skill in the field, however, that the disclosed embodiments are exemplary and not exhaustive of all possible embodiments.

Throughout this disclosure, a hyphenated form of a reference numeral refers to a specific instance of an element and the un-hyphenated form of the reference numeral refers to the element generically or collectively. Thus, as an example (not shown in the drawings), widget "12-1" refers to an instance of a widget class, which may be referred to collectively as widgets "12" and any one of which may be referred to generically as a widget "12". In the figures and the description, like numerals are intended to represent like elements.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a server, a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

Additionally, the information handling system may include firmware for controlling and/or communicating with, for example, hard drives, network circuitry, memory devices, I/O devices, and other peripheral devices. As used in this disclosure, firmware includes software embedded in an information handling system component used to perform predefined tasks. Firmware is commonly stored in non-volatile memory, or memory that does not lose stored data upon the loss of power. In certain embodiments, firmware associated with an information handling system component is stored in non-volatile memory that is accessible to one or more information handling system components. In the same or alternative embodiments, firmware associated with an information handling system component is stored in non-volatile memory that is dedicated to and comprises part of that component.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-5 wherein like numbers are used to indicate like and corresponding parts.

Turning now to the drawings, FIG. 1 illustrates a block diagram depicting selected elements of an embodiment of information handling system 100. In one embodiment, information handling system 100 may be configured to regulate its own airflow and/or to regulate airflow within another information handling system. Also shown with information handling system 100 are external or remote elements, namely, network 155 and network storage resource 170.

As shown in FIG. 1, components of information handling system 100 may include, but are not limited to, processor subsystem 120, which may comprise one or more processors, and system bus 121 that communicatively couples various system components to processor subsystem 120 including, for example, memory subsystem 130, I/O subsystem 140, local storage resource 150, and network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI Express (PCIe) bus, HyperTransport (HT) bus, and Video Electronics Standards Association (VESA) local bus.

In FIG. 1, network interface 160 may be a suitable system, apparatus, or device operable to serve as an interface between information handling system 100 and a network 155. Network interface 160 may enable information handling system 100 to communicate over network 155 using a suitable transmission protocol and/or standard, including, but not limited to, transmission protocols and/or standards enumerated below with respect to the discussion of network 155. In some embodiments, network interface 160 may be communicatively coupled via network 155 to network storage resource 170. Network 155 may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network 155 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 155 and its various components may be implemented using hardware, software, or any combination thereof. In certain embodiments, system 100 and network 155 may be included in a rack domain.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of physical hardware 102). In the same or alternative embodiments, processor subsystem 120 may interpret and/or execute program instructions and/or process data stored remotely (e.g., in a network storage resource).

Also in FIG. 1, memory subsystem 130 may comprise a system, device, or apparatus operable to retain and/or retrieve program instructions and/or data for a period of time (e.g., computer-readable media). As shown in the example embodiment of FIG. 1, memory subsystem 130 stores user-personalized wake policy 132, which may include instructions executable by processor subsystem 120 to implement the methods described herein. It is noted that in different embodiments, user-personalized wake policy 132 may be stored at network storage resource 170 and may be accessed by processor subsystem 120 via network 155 Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as information handling system 100, is powered down.

In FIG. 1, local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. For example, local storage resource 150 may store executable code in the form of program files that may be loaded into memory subsystem 130 for execution, such as user-personalized wake policy 132. In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In certain embodiments, I/O subsystem 140 may comprise a touch panel and/or a display adapter. The touch panel (not shown) may include circuitry for enabling touch functionality in conjunction with a display (not shown) that is driven by display adapter (not shown).

Referring now to FIG. 2, selected elements of an embodiment of an information handling system 200 are illustrated for regulating airflow within information handling system 200 in order to cool certain elements shown. FIG. 2 shows a component layout view of certain exemplary components of information handling system 200. The components shown in FIG. 2 are not drawn to scale and information handling system 200 may contain additional or fewer components than the components shown in FIG. 2. Components of information handling system 200 may be interconnected with each other as well as with other components not shown in FIG. 2. However, connections between components are omitted in FIG. 2 for descriptive clarity. In FIG. 2, information handling system 200 may implement an embodiment of information handling system 100 described above with respect to FIG. 1.

As shown in FIG. 2, information handling system 200 may include circuit board 202. Circuit board 202 may be contained within chassis 204. Chassis 204 may be enclosed in any suitable manner. For example, chassis 204 may include front panel 206-1 and back panel 206-2. Front panel 206-1 and back panel 206-2 may include one or more input/output connectors (not shown) allowing information handling system 200 to interconnect with additional information handling systems and/or other devices (not shown). To cool information handling system 200, airflow 208 may be directed over circuit board 202. Such airflow may be made in a suitable direction. For example, airflow 208 may be made in a direction from front panel 206-1 toward back panel 206-2. Airflow 208 may be generated by a plurality of fans 210 (e.g., fans 210-1 through 210-6) residing within information handling system 200. In one embodiment, each fan 210 may be associated with a respective thermal region 212 (e.g., thermal regions 212-1 through 212-6) of circuit board 202. Each thermal region 212 may include one or more thermal components such as high priority components 220, medium priority components 222, and low priority components 224. For convenience, certain thermal components shown within information handling system 200 are labeled with a designator indicating a thermal region 212 to which the thermal components belong. For example, two high priority components 220 shown within information handling system 200 are labeled as 220-2 (corresponding to thermal region 212-2) and 220-5 (corresponding to thermal region 212-5). For convenience of description, certain thermal components in FIG. 2 are associated with exactly one thermal region 212. It is noted, however, that other thermal components may be associated with more than one thermal region 212. For example, small dynamic card 226, medium dynamic card 228, and large dynamic card 230 may be associated with more than one thermal region 212. For example, large dynamic card 230 is associated with thermal regions 212-1, 212-2, and 212-3.

As shown in FIG. 2, information handling system 200 and/or various components included therein may be contained within chassis 204. Chassis 204 of information handling system 200 may include any case or enclosure adapted to hold or encompass information handling system 200 or various components of information handling system 200. Chassis 204 may be constructed from steel, aluminum, plastic, glass, any other suitable material, or any combination of these. Certain types of information handling systems may be well suited to particular types of chassis. For example, information handling system 200 may be a server module and may thus be well suited to a rack-type chassis. Chassis 204 may be a rack-type chassis adapted to fit alongside other server modules contained in similar rack-type chassis within a frame or rack adapted to hold multiple server modules. In a rack setup, each server module may be independent or interdependent. Thus, an information handling system may exist on one server module as shown in FIG. 2, or an information handling system may exist across multiple server modules in a rack or many server modules in multiple racks (not shown).

In some examples, a plurality of fans may be used to cool a single information handling system. For example, as shown in FIG. 2, six fans 210 are used to cool information handling system 200. As such, information handling system 200 may be subdivided into a plurality of thermal regions 212, wherein each thermal region is associated with one or more fans 210. Thermal regions may be discrete or may overlap. Thermal regions may be distinct and well-defined or indistinct and loosely defined. For example, FIG. 2 shows six thermal regions 212 situated as parallel strips along circuit board 202, each thermal region 212 being associating with one fan 210. Although FIG. 2 shows thermal regions 212 as being situated as parallel strips along circuit board 202, it will be appreciated that thermal regions 212 may be situated in any suitable way. For example, in some embodiments, four thermal regions may be situated in four quadrants of a circuit board (not shown). In other embodiments, a thermal region may include a server module associated with an information handling system encompassing multiple server modules in one or more racks.

As shown in FIG. 2, each thermal region 212 on circuit board 202 may include one or more thermal components cooled by a fan 210 that is associated with the particular thermal region 212. For example, as shown, thermal region 212-1 may include at least a portion of three thermal components. Thermal region 212-1 may include medium priority component 222-1. Thermal region 212-1 may also include low priority component 224-1. Thermal region 212-1 may also include a portion of large dynamic card 230.

As shown, thermal region 212-2 may include at least a portion of three thermal components. Thermal region 212-2 may include high priority component 220-2. Thermal region 212-2 may also include low priority component 224-2. Thermal region 212-2 may also include a portion of large dynamic card 230.

As shown, thermal region 212-3 may include at least a portion of four thermal components. Thermal region 212-3 may include medium priority component 222-3. Thermal region 212-3 may also include low priority component 224-3. Thermal region 212-3 may also include a portion of medium dynamic card 228. Thermal region 212-3 may also include a portion of large dynamic card 230.

As shown, thermal region 212-4 may include at least a portion of three thermal components. Thermal region 212-4 may include medium priority component 222-4. Thermal region 212-4 may also include a portion of medium dynamic card 228. Thermal region 212-4 may also include low priority component 224-4.

As shown, thermal region 212-5 may include at least a portion of four thermal components. Thermal region 212-5 may include high priority component 220-5. Thermal region 212-5 may also include a portion of medium dynamic card 228. Thermal region 212-5 may also include low priority component 224-5. Thermal region 212-5 may also include a portion of small dynamic card 226.

Finally, as shown, thermal region 212-6 may include at least a portion of three thermal components. Thermal region 212-6 may include medium priority component 222-6. Thermal region 212-6 may also include low priority component 224-6. Thermal region 212-6 may also include a portion of small dynamic card 226.

In FIG. 2, airflow 208 may be controlled and/or regulated by fans 210. Fans 210 may include any device capable of directing airflow 208, for example, a computer fan. Fans 210 may be configured to actively cool information handling system 200 by directing airflow 208 across a surface of circuit card 202. For example, airflow 208 may cool information handling system 200 by drawing heat away from various thermal components of information handling system 200. In some examples, a particular fan may be associated with a particular thermal component of information handling system 200. For example, a fan may be attached to a heat sink of a particular component such as a processor (not shown). Fans 210 may also be associated with particular thermal regions 212 of an information handling system. For example, as shown in FIG. 2, fan 210-1 is associated with thermal region 212-1, fan 210-2 is associated with thermal region 212-2, and so forth. In certain examples, fans may also be associated with the information handling system generally. For example, a fan may be associated with one server module contained in a rack containing several server modules (not shown). As shown, fans 210 are included within chassis 204 of information handling system 200. In other examples, however, fans may be included outside a chassis or may be attached to a chassis of an information handling system. To generate airflow 208, fans 210 may draw relatively cool air from outside the chassis (e.g., ambient air near front panel 206-1) into the chassis and may expel relatively warm air from inside the chassis back out of the chassis (e.g., near back panel 206-2).

Fans 210 may direct airflow 208 to move across thermal components within information handling system 200 to cool information handling system 200. Thermal components may include any components within information handling system 200 that may be cooled by airflow 208. For example, among the thermal components illustrated in FIG. 2 are circuit board 202, chassis 204, high priority components 220, medium priority components 222, low priority components 224, small dynamic card 226, medium dynamic card 228, and large dynamic card 230. In certain examples, thermal components within information handling system 200 may include processors, memory devices, computer-readable media, buses, communication interface cards, etc. Thermal components may consume power, causing the thermal components to heat up. When fans 210 direct airflow 208 to move across circuit board 202 and the other thermal components disposed thereon, heat may be drawn away from information handling system 200, cooling information handling system 200. Accordingly, using airflow 208 to cool information handling system 200, fans 210 may regulate the temperature of information handling system 200.

Referring now to FIG. 3, a block diagram of selected elements of an embodiment of a fan control subsystem 300 is illustrated. FIG. 3 is a schematic illustration and is not drawn to scale. In FIG. 3, fan control subsystem 300 may control fans 210 to regulate airflow 208 to cool or otherwise regulate the temperature of information handling system 200. In certain embodiments, fan control subsystem 300 may be integrated with or included within information handling system 200. In other embodiments, fan control subsystem 300 may be independent from information handling system 200. For example, fan control subsystem 300 may be integrated with an information handling system tasked with cooling one or more other information handling systems including information handling system 200. As shown, fan control subsystem 300 includes processor 302. Processor 302 may be implemented by any type of processor, such as a microcontroller, a digital signal processor (DSP), a field-programmable gate-array, an application-specific integrated circuit, digital or analog circuitry, etc. Processor 302 may be communicatively coupled to memory 304. Memory 304 may be implemented by computer-readable memory media. Memory 304 may encompass persistent and volatile media, fixed and removable media, and magnetic and semiconductor media, among others. Memory 304 is operable to store instructions, data, or both. Memory 304 may include or store sets or sequences of instructions executable by processor 302, as well as other information, such as data related to fan control, as disclosed herein. As shown, memory 304 stores firmware 306, which may include executable instructions to implement at least a portion of the functionality described herein with respect to fan control.

In embodiments where fan control subsystem 300 is integrated with or included within information handling system 200, certain components of fan control subsystem 300 may be associated with or the same as components of information handling system 200, described above in relation to FIGS. 1 and 2. For example, processor 302 of fan control subsystem 300 may be associated with or implemented by high priority components 220-2 and/or 220-5 (see FIG. 2). In addition, high priority components 220-2 and/or 220-5 may also be associated with processor subsystem 120 (see FIG. 1) within information handling system 200. Accordingly, information handling system 200 may self-regulate its own temperature by using fan control subsystem 300, integrated within information handling system 200, to cool information handling system 200.

As shown in FIG. 3, fans 210 are communicatively coupled to fan control subsystem 300. As such, fan control subsystem 300 may control and/or otherwise communicate with fans 210 and may thereby regulate the temperature of information handling system 200 (see FIG. 2). In certain embodiments, fan control subsystem 300 may control fans 210 according to respective fan importance factors. A fan importance factor may be associated with each of fans 210. The fan importance factor associated with a particular fan signifies a relative importance of the particular fan as compared to other fans. Specifically, if a first fan has a higher fan importance factor than a second fan, the first fan may be considered more important to cooling the information handling system than the second fan. For example, the first fan may be considered more important than the second fan because the thermal region associated with the first fan may be more difficult to cool or may include thermal components that are more critical to the information handling system as compared to the thermal region associated with the second fan.

Fan control subsystem 300 may determine the fan importance factors for each of fans 210 in any suitable way. In some examples, a fan importance factor may be predetermined (e.g., by a designer, user, technician, etc.) and preprogrammed into fan control subsystem 300, such as into memory 304. Thus, fan control subsystem 300 may determine the fan importance factor by retrieving the fan importance factor from memory 304. In other examples, fan control subsystem 300 may determine a fan importance factor of a fan by computing the fan importance factor based on a presence of one or more thermal components in a thermal region associated with the fan. Fan control subsystem 300 may also compute the fan importance factor based on respective thermal priority ratings of the one or more thermal components present in the thermal region associated with the fan, as will be described in more detail below. For example, if a fan is associated with a thermal region that has several thermal components with high thermal priority ratings, the fan may be of relatively high importance for cooling the information handling system and may thus have a relatively high fan importance factor.

A thermal priority rating of a thermal component may include any index, score, etc. associated with a priority level for cooling the thermal component within an information handling system. For example, a thermal component with a high thermal priority rating may be important or even critical to proper operation of the information handling system. Additionally or alternatively, the thermal component with the high thermal priority rating may be particularly difficult to cool due to high power consumption and heat or due to the placement of the thermal component in the layout of the information handling system. In other examples, a thermal component with a low thermal priority rating may be less important to proper functionality of the information handling system. Additionally or alternatively, the thermal component with the low thermal priority rating may be relatively trivial to cool.

As such, a thermal priority rating may be determined by any suitable factors or parameters affecting the cooling of the thermal component. In certain examples, a thermal priority rating may be based at least in part on how much power the thermal component consumes. For example, a thermal component that consumes a large amount of power may have an increased thermal priority rating. Similarly, a thermal component that consumes a small amount of power may have a decreased thermal priority rating. In other examples, a thermal priority rating may be based at least in part on a maximum temperature parameter specified for proper operation of the thermal component. For example, a thermal component not capable of operating properly at a high maximum temperature may have an increased thermal priority rating. Similarly, a thermal component that is designed to operate properly at high maximum temperatures may have a decreased thermal priority rating. In yet other examples, a thermal priority rating may be based at least in part on a proximity of the thermal component to one or more fans in the layout of the information handling system. For example, a thermal component far away from the fans may have an increased thermal priority rating. Similarly, a thermal component near the fans may have a decreased thermal priority rating. In yet other examples, a thermal priority rating may be based at least in part on a proximity of the thermal component to one or more other thermal components. For example, a thermal component proximate other thermal components may have an increased thermal priority rating, particularly if the other thermal components themselves have high thermal priority ratings. Similarly, a thermal component isolated from other thermal components may have a decreased thermal priority rating. In yet other examples, a thermal priority rating may be based at least in part on the importance of the thermal component for desired operation of the information handling system. For example, a thermal component that is crucial to operations of the information handling system (e.g., a processor) may have an increased thermal priority rating. Similarly, a thermal component that is less important to operations of the information handling system may have a decreased thermal priority rating. In yet other examples, a thermal priority rating may be based at least in part on the availability of individual active or passive means for cooling the thermal component such as a heat sink or individual fan associated with the thermal component. For example, a thermal component that relies solely on system fans (e.g., fans 210) to be cooled may have an increased thermal priority rating. Similarly, a thermal component that includes a heat sink and/or an individual fan may have a decreased thermal priority rating. In yet other examples, a thermal priority rating may be based at least in part on a power density of the thermal component. For example, a thermal component with a high power density may have an increased thermal priority rating. Similarly, a thermal component with a low power density may have a decreased thermal priority rating. In yet other examples, a thermal priority rating may be based at least in part on a surface area of the thermal component. For example, a thermal component with a large surface area may have an increased thermal priority rating. Similarly, a thermal component with a small surface area may have a decreased thermal priority rating. In various other examples, thermal priority ratings may be based on one or more of the factors described above and/or on any other factor or parameter associated with the thermal component that may affect how important and/or difficult the thermal component is to cool.

Thermal priority ratings may be calculated and associated with thermal components in any suitable way. In certain examples, thermal priority ratings may be predetermined (e.g., by a designer, user, technician, etc.) and preprogrammed into the fan control subsystem, such as into memory 304 of fan control subsystem 300. In other examples, thermal priority ratings may be determined for certain components automatically and/or dynamically by information handling system 200 or fan control subsystem 300 without human intervention. Referring to FIG. 2, various factors may be considered in determining whether high priority component 220-2 or medium priority component 222-1 is a higher priority to cool. For example, although the distance between medium priority component 222-1 and fan 210-1 may be greater than the distance between high priority component 220-2 and fan 210-2, high priority thermal component 220-2 may be a more crucial component, such as a processor, and/or may generate more heat. Considering several parameters related to cooling high priority component 220-2 and medium priority component 222-1 in this way, it may be determined that a higher thermal priority rating should be associated with high priority component 220-2 than with medium priority component 222-1. In various embodiments, more or fewer parameters may be considered and weighed in any manner that suits the various embodiments.

Fan control subsystem 300 may determine the presence and location of thermal components of information handling system 200 in any suitable way. For example, board layout information indicative of the presence and location of each thermal component may be automatically detected or pre-programmed and stored in memory 304 where the board layout information may be accessed by fan control subsystem 300. Additionally, information handling system 200 may solicit information indicative of the presence and location of thermal components from a person (e.g., a designer, a user, a technician, etc.), who may input the information into memory 304 to be accessed by fan control subsystem 300. In various embodiments, the presence and location of certain thermal components may be preprogrammed while the presence and location of other thermal components may be automatically detected by fan control subsystem 300. For example, high priority components 220, medium priority components 222, and low priority components 224 may be fixed to circuit board 202, and may be represented by preprogrammed information stored in memory 304. Meanwhile, small dynamic card 226, medium dynamic card 228, and large dynamic card 230 may be transitory or dynamic. For example, dynamic cards 226, 228, and 230 may be PCI Express cards. As such, dynamic cards 226, 228, and 230 may be installed onto or removed from circuit board 202. Additionally, a particular socket adapted to accept a large dynamic card such as large dynamic card 230 may also accept a small dynamic card such as small dynamic card 226. Accordingly, determining the presence and location of all the thermal components within a thermal region 212 may include receiving preprogrammed information about certain thermal components (e.g., components 220, 222, and 224) and detecting information about other thermal components (e.g., dynamic cards 226, 228, and 230).

Based on information indicative of the thermal priority rating and presence of each thermal component in each thermal region 212 of information handling system 200, fan control subsystem 300 may determine a fan importance factor associated with each fan 210 to indicate the importance of each fan 210 relative to the other fans 210. For example, referring to information handling system 200 in FIG. 2, thermal region 212-1 may be thermally identical to thermal region 212-2 except that thermal region 212-1 includes medium priority component 222-1 while thermal region 212-2 includes high priority component 220-2. Because high priority component 220-2 may be more difficult to cool than medium priority component 222-1, as described above in relation to thermal priority ratings, fan control subsystem 300 may determine a higher fan importance factor for fan 210-2 than for fan 210-1.

Specifically, fan control subsystem 300 may determine that thermal region 212-1 includes at least a portion of three thermal components: medium priority component 222-1, low priority component 224-1, and large dynamic card 230. Fan control subsystem 300 may further determine that medium priority component 222-1 has a moderate thermal priority rating, that low priority component 224-1 has a low thermal priority rating, and that large dynamic card 230 has a low thermal priority rating. Based on the presence and the thermal priority ratings of medium priority component 222-1, low priority component 224-1, and large dynamic card 230, fan control subsystem 300 may determine a fan importance factor for fan 210-1 associated with thermal region 212-1. Fan control subsystem 300 may also determine that thermal region 212-2 includes at least a portion of three thermal components: high priority component 220-2, low priority component 224-2, and large dynamic card 230. Fan control subsystem 300 may further determine that high priority component 220-2 has a high thermal priority rating, for example, a thermal priority rating higher than the thermal priority rating of medium priority component 222-1. Fan control subsystem 300 may further determine that low priority component 224-2 has an equal thermal priority rating to low priority component 224-1. Accordingly, fan control subsystem 300 may determine a fan importance factor for fan 210-2 associated with thermal region 212-2 that is higher than the fan importance factor of fan 210-1 associated with thermal region 212-1. The higher fan importance factor of fan 210-2 reflects the presence of high priority component 220-2, which is a higher priority to cool than medium priority component 222-1. Accordingly, the higher fan importance factor of fan 210-2 indicates that fan 210-2 is more important than fan 210-1 for cooling information handling system 200.

FIGS. 4A, 4B, and 4C illustrate various tables representative of information that may be used by fan control subsystem 300 to determine fan importance factors of each of fans 210. For example, fan control subsystem 300 may receive or detect the information represented in FIGS. 4A, 4B, and 4C, and may store the information in memory 304. Subsequently, fan control subsystem 300 may use the information from one or more of FIGS. 4A, 4B, and 4C to determine respective fan importance factors associated with each of fans 210.

In FIG. 4A, location table 400 shows a table representation indicative of the presence and location of various thermal components of information handling system 200. Along horizontal axis 402, each of fans 210 corresponds to a vertical column. Along vertical axis 404, various thermal components of information handling system 200 correspond to a horizontal row. As shown, a mark is placed in each respective row and column where a particular fan 210 is associated with a particular thermal component. For example, because high priority component 220-2 is located in thermal region 212-2 (see FIG. 2), high priority component 220-2 is associated with fan 210-2 and a mark is present in the column of fan 210-2 and the row of high priority component 220-2.

In FIG. 4B, thermal priority ratings table 410 shows a table representation indicative of the thermal priority ratings of various thermal components of information handling system 200. Along vertical axis 414, various thermal components of information handling system 200 correspond to a horizontal row. In column 412, a thermal priority rating between 1 and 10 is shown for each thermal component. For example, because high priority component 220-2 is a high priority to cool, a thermal priority rating of 9 is shown for high priority component 220-2. It is noted that thermal priority ratings may be relative to one another. In various embodiments, thermal priority ratings may include values other than integers between 1 and 10.

In FIG. 4C, fan importance factor table 420 shows a table combining information indicative of the presence and location of the various thermal components of information handling system 200 from location table 400 (see FIG. 4A), and information indicative of the thermal priority ratings of the various thermal components from thermal priority ratings table 410 (see FIG. 4B). Along horizontal axis 422, each of fans 210 corresponds to a vertical column. Along vertical axis 424, the same thermal components of information handling system 200 represented in tables 400 and 410 each correspond to a horizontal row. As shown, a respective thermal priority rating for each thermal component according to thermal priority ratings table 420 is placed in a row and column corresponding to the location of each thermal component corresponding to location table 400. For example, high priority component 220-2 has a thermal priority rating of 9 according to thermal priority ratings table 420. High priority component 220-2 is located in a thermal region associated with fan 210-2 according to location table 400. Therefore, a 9 is shown in a cell corresponding to the row for high priority component 220-2 and the column for fan 210-2.

As shown in FIG. 4C, raw fan importance factor row 426 includes a fan importance factor corresponding to each of fans 210 equaling a sum total of the thermal priority ratings listed in each vertical column along horizontal axis 422. The fan importance factors shown in raw fan importance factor row 426 may be referred to as raw fan importance factors. For example, fan 210-1 is shown with a raw fan importance factor of 11 because 11 is the sum of the thermal priority ratings of medium priority component 222-1 (i.e. 6), low priority component 224-1 (i.e. 3), and large dynamic card 230 (i.e. 2).

Normalized fan importance factor row 428 also includes a fan importance factor corresponding to each of fans 210. As shown, the fan importance factors in normalized fan importance factor row 428 are derived from respective raw fan importance factors from raw fan importance factor row 426 by normalizing each raw fan importance factor such that the lowest fan importance factor is equal to 1.00. The fan importance factors shown in normalized fan importance factor row 428 may be referred to as normalized fan importance factors. For example, because 7, the fan importance factor corresponding to fan 210-4, is the lowest raw fan importance factor on raw fan importance factor row 426, each raw fan importance factor is divided by 7 to derive the normalized fan importance factors of normalized fan importance factor row 428. Thus, for example, fan 210-1 is shown with a normalized fan importance factor of 1.57 because 1.57 is the approximate quotient of 11 divided by 7.

Relative importance ranking row 430 may include a relative importance ranking corresponding to each of fans 210. As shown, the relative importance rankings in relative importance ranking row 430 are derived from respective fan importance factors from raw fan importance factor row 426 and/or normalized fan importance factor row 428 by ranking each fan 210 from a most important fan having a highest fan importance factor down to a least important fan having a lowest fan importance factor. For example, because fan 210-2 has the highest fan importance factor in raw fan importance factor row 426 and in normalized fan importance factor row 428, fan 210-2 is ranked with a number 1, indicative that fan 210-2 may be the most important fan. Similarly, as shown, fan 210-3 is ranked as the second most important fan, fan 210-5 is ranked as the third most important fan, fans 210-1 and 210-6 are each ranked as the fourth most important fans because fans 210-1 and 210-6 have equal fan importance factors, and fan 210-4 is ranked as the fifth most important fan. Thus, in information handling system 200, fan 210-4 may be the least important fan.

In information handling system 200, one or more of fans 210 may fail at any time due to various circumstances. The failure of a fan may be detrimental to operations and/or performance of information handling system 200. For example, the temperature of one or more thermal components in information handling system 200 may not be properly regulated after fan failure because airflow to cool the thermal components is reduced. In particular, temperatures of thermal components in a thermal region associated with a failed fan may increase until proper operation and performance of the thermal components is affected. In some examples, a temperature of a thermal component may increase above a maximum temperature threshold specified for the thermal component and the thermal component may cease functioning or may function improperly. Accordingly, fan control subsystem 300 may be configured to detect a fan failure and, in response, regulate airflow in information handling system 200 to minimize negative effects of fan failure on information handling system 200 until the failed fan may be remedied.

Fan control subsystem 300 may detect a fan failure in any suitable way. For example, fan control subsystem 300 may automatically detect that a fan has failed by receiving a signal from the failed fan or by not receiving expected feedback from the failed fan. A user of information handling system 200 may also input information into fan control subsystem 300 indicative that a particular fan has failed.

In response to detecting the failure of a fan in information handling system 200, fan control subsystem 300 may regulate airflow 208 in information handling system 200 to minimize negative effects of the fan failure on information handling system 200. In various embodiments, fan control subsystem 300 may determine one or more fan importance factors and/or relative importance rankings for fans 210 as described above in relation to FIGS. 4A, 4B, and 4C, and may regulate airflow 208 based the fan importance factors and/or relative importance rankings. Various embodiments of fan control subsystem 300 may present particular limitations and/or opportunities for regulating airflow 208 by fan control subsystem 300. For example, in some embodiments, it may be desirable that fan control subsystem 300 regulate airflow 208 automatically without human intervention. In other embodiments, a technician may be available to perform a task directed by fan control subsystem 300.

Certain information handling systems may include "closed loop" thermal components with independent thermal sensors that may independently or cooperatively control fans within information handling system 200. In certain examples, a closed loop thermal component may be associated with an individual fan and may be configured to control the individual fan. For example, a closed loop thermal component may directly control an individual fan mounted on a heat sink attached to the closed loop thermal component(not shown). In other examples, a closed loop thermal component may share control over shared system fans such as fans 210. For example, a closed loop thermal component may share control over fans 210 with fan control subsystem 300. Specifically, the closed loop thermal component may cause a fan speed of one of fans 210 to increase beyond a fan speed directed by fan control subsystem 300. While closed loop thermal components may independently self-regulate their temperature at least partially, "open loop" thermal components may be cooled only by airflow 208 generated by fans 210. Accordingly, in certain embodiments including both closed loop and open loop thermal components, fan control subsystem 300 may be configured to ignore closed loop thermal components to determine fan importance factors based only on open loop thermal components. In other embodiments, both closed loop thermal components and open loop thermal components may be taken into account to determine fan importance factors of fans 210. Still other embodiments may include only open loop thermal components such that fan importance factors may be determined based only on the open loop thermal components.

Additionally, certain embodiments of fan control subsystem 300 may have access to additional information about information handling system 200 that is not available in all embodiments. For example, fan control subsystem 300, as implemented in certain embodiments described in more detail below, may receive or detect information indicative of a nominal volumetric airflow associated with cooling information handling system 200 when all of fans 210 are operational. Regardless of variations between various embodiments, fan importance factors and relative importance rankings for fans may provide valuable insight into airflow in an information handling system and may facilitate various approaches for efficiently and appropriately regulating and/or optimizing the airflow according to the circumstances of a particular situation. Certain exemplary approaches for regulating airflow are now described.

In certain embodiments, regulating the airflow in response to detecting that a fan has failed may include directing a user (e.g., a technician, an operator of information handling system 200, etc.) to swap the failed fan with an operational fan, based on fan importance factors and/or relative importance rankings of the failed fan and the operational fan. Specifically, fan control subsystem 300 may direct the user to swap a failed fan with any operational fan having an equal or lower fan importance factor than the failed fan. Equivalently, fan control subsystem 300 may direct the user to swap the failed fan with any operational fan having an equal or higher relative importance ranking as the failed fan. For example, when fan control subsystem 300 detects that fan 210-2 fails, fan control subsystem 300 may direct that fan 210-2, the most important fan in information handling system 200 based on the fan importance factor and relative importance ranking of fan 210-2 (see FIG. 4C), be swapped with fan 210-4, the least important fan in information handling system 200 based on the fan importance factor and relative importance ranking of fan 210-4. In other examples, fan control subsystem 300 may determine that, while airflow 208 may be most optimized by swapping fan 210-2 with fan 210-4, airflow 208 may still be at least somewhat improved by swapping fan 210-2 with another operational fan 210 having a lower fan importance factor and a higher relative importance ranking than fan 210-2 (e.g., fans 210-1, 210-3, 210-5, or 210-6). Accordingly, fan control subsystem 300 may direct the user to swap fan 210-2 with an operational fan other than fan 210-4. In certain embodiments, fan control subsystem 300 may provide a plurality of options to the user for the fan swapping. For example, fan control subsystem 300 may indicate that swapping fan 210-2 with fan 210-4 may be preferred, but that swapping fan 210-2 with fan 210-1 or with fan 210-6 would also be suitable.

When fans other than the most important fan (e.g., fan 210-2) fail, fewer swapping options may be available to improve cooling in information handling system 200. For example, when fan 210-1 fails, fan control subsystem 300 may recommend swapping fan 210-1 with fan 210-4 or fan 210-6, but may not recommend any other swap because every fan other than fan 210-4 has a higher fan importance factor and lower relative importance ranking than fan 210-1. Similarly, when fan control subsystem 300 detects that fan 210-4—the least important fan 210—fails, fan control subsystem 300 may determine that swapping any fan with fan 210-4 would serve to inhibit cooling in information handling system 200 because the fan importance factor of every operational fan 210 is higher than the fan importance factor of fan 210-4. Accordingly, fan control subsystem 300 may direct the user to not swap fan 210-4 with any other fan 210 or may not direct the user to do anything.

Fan control subsystem 300 may direct the user to swap fans in any suitable way. For example, fan control subsystem 300 may provide a pop-up dialog box directing the user to physically perform the fan swapping. Additionally or alternatively, fan control subsystem 300 may provide an output message or error code directing that the fans be swapped in an event log associated with information handling system 200.

In certain embodiments, regulating the airflow in response to detecting that a fan has failed may include increasing a fan speed of one or more operational fans based on the fan importance factor determined for the failed fan. For example, when fan control subsystem 300 detects a fan failure, fan control subsystem 300 may cause all of the operational fans 210 to increase in fan speed based on the fan importance factor of the failed fan. In certain embodiments, the fan speed of each operational fan 210 may be increased by multiplying a current fan speed of each operational fan by the normalized fan importance factor of the failed fan. Thus, for example, when fan 210-6 fails, fan control subsystem 300 may cause the operational fans 210 (e.g., fans 210-1 through 210-5) to each automatically increase by a factor of 1.57, the normalized fan importance factor of fan 210-6. When other fans fail, the fan speed increase may be more or less than 1.57 depending on the fan importance factor of the failed fan. For example, when fan 210-5 fails, fan control subsystem 300 may direct each of the operational fans remaining (e.g., fans 210-1 through 210-4 and fan 210-6) to automatically increase in fan speed by a factor of 1.71, the normalized fan importance factor of fan 210-5. Because fan 210-5 is more important than fan 210-6, the failure of fan 210-5 causes a more impactful response than a failure of fan 210-6.

In certain embodiments, fan control subsystem 300 may determine a nominal volumetric airflow associated with cooling information handling system 200 when all fans 210 are operational. For example, fan control subsystem 300 may access information indicative of a nominal magnitude of airflow 208, expressed in units of air volume over units of time, associated with nominal operation of information handling system 200 before any fan 210 has failed. Fan control subsystem 300 may automatically detect the nominal volumetric airflow information using a sensor that measures airflow or may receive the information from a user. In response to detecting a fan failure, fan control subsystem 300 may regulate airflow 208 at least in part by automatically increasing the fan speed of the operational fans 210 based on their individual fan importance factors. In certain embodiments, fan control subsystem 300 may increase the fan speed of each operational fan 210 by its normalized fan importance factor until a dynamically measured actual volumetric airflow matches the nominal volumetric airflow. Specifically, when fan 210-3 fails, the fan speed of fan 210-1 may be multiplied by 1.57, the fan speed of fan 210-2 may be multiplied by 2.14, the fan speed of fan 210-4 may be multiplied by 1.00 (i.e. remain unchanged), the fan speed of fan 210-5 may be multiplied by 1.71, and the fan speed of fan 210-6 may be multiplied by 1.57, according to normalized fan importance factors of each fan 210 in normalized fan importance factor row 428. In other examples, each fan may be increased by greater or lessor factors, although the increase of each fan relative to the others may still be based on the fan importance factors of each fan. Fan control subsystem 300 may cause the fan speeds of operational fans 210 to remain elevated according to their fan importance factors at least as long as fan control subsystem 300 determines that the actual volumetric airflow is less than the nominal volumetric airflow.

In certain embodiments, regulating the airflow in response to detecting that a fan has failed may include directing that a thermal characteristic of a thermal region associated with the failed fan be altered based on the fan importance factors and/or relative importance rankings of the failed fan and/or the operational fans. Fan control subsystem 300 may direct that the thermal characteristic of the thermal region be altered in any suitable way. For example, in certain embodiments, fan control subsystem 300 may direct a user to swap a thermal component in the thermal region with a thermal component in a different thermal region. In the same or other embodiments, fan control subsystem 300 may direct the thermal component to be removed from the thermal region. In the same or other embodiments, fan control subsystem 300 may automatically direct the thermal component to consume less power. In the same or other embodiments, fan control subsystem 300 may direct that the thermal characteristic of the thermal region be altered by other means that may suit the particular embodiments.

For example, when fan 210-2 is detected to fail, fan control subsystem 300 may direct that large dynamic card 230 be swapped with medium dynamic card 228 based on the high fan importance factor of fan 210-2 and the lower fan importance factors for the fans 210 associated with medium dynamic card 228 (i.e. fans 210-3, 210-4, and 210-5). In other examples, fan control subsystem 300 may direct that dynamic card 230 be removed from first thermal region 212-2 or fan control subsystem 300 may automatically direct that dynamic card 230 consume less power, for example by switching dynamic card 230 into a low power state. In yet other examples, large dynamic card 230 may be moved away from thermal region 212-2 to another socket adapted to receive large dynamic card 230 (not shown). It is noted that large dynamic card 230 and thermal region 212-2 are used as examples only, and that any thermal component within a thermal region associated with a failed fan may be swapped, removed, or powered down to alter the thermal characteristic of the thermal region associated with the failed fan.

In addition or as an alternative to regulating the airflow as described in relation to the various embodiments above, fan control subsystem 300 may also regulate performance of an information handling system by limiting power to certain thermal components. For example, a closed loop thermal component (e.g., a high priority component such as a processor) may be active in a thermal region after a fan associated with the thermal region fails. In response to the fan failure, the thermal component may be preemptively power limited in anticipation that the thermal component will increase in temperature. However, because the thermal component is closed loop, the thermal component may cause fans from neighboring thermal regions to increase in fan speed independently of fan control subsystem 300 as the thermal component increases in temperature. Accordingly, fan control subsystem 300 may at least temporarily abstain from limiting the power of the thermal component. Specifically, fan control subsystem 300 may determine that a thermal margin exists between the current temperature of the thermal component and a maximum temperature for the thermal component (e.g., a maximum rated temperature specified by a manufacturer of the thermal component, a characterized temperature at which the thermal component may fail, a temperature budgeted for the thermal component in a thermal plan, etc.). When the thermal margin is detected, fan control subsystem 300 may abstain from preemptive power limiting of the thermal component while continuing to monitor the temperature of the thermal component. In some examples, operational fans being controlled by the closed loop of the thermal component independently from fan control subsystem 300 may allow the thermal component to maintain the thermal margin indefinitely. As such, fan control subsystem 300 may continuously abstain from limiting power to the thermal component. In other examples, fan control subsystem 300 may eventually detect that the thermal component lacks a sufficient thermal margin. Here, fan control subsystem 300 may progressively limit power to the thermal component such that the thermal component receives is only limited in power in proportion to an increase of the current temperature of the thermal component. For example, fan control subsystem 300 may limit power to the thermal component such that the thermal component receives as much power as possible without exceeding the maximum temperature for the thermal component.

Figure 5:
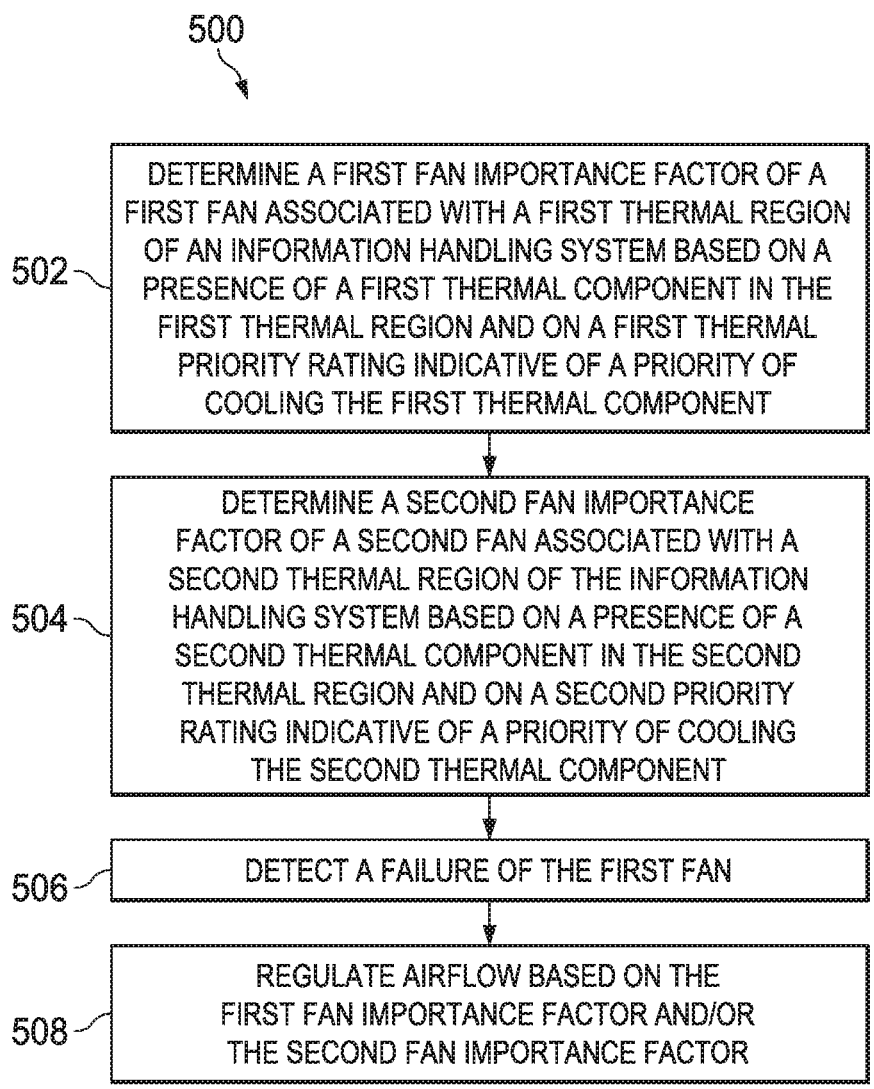
FIG. 5 is a flowchart depicting selected elements of an embodiment of a method for regulating airflow and performance in an information handling system after fan failure is detected.

Referring now to FIG. 5, a flowchart of selected elements of an embodiment of method 500 for regulating airflow and performance in an information handling system after fan failure is depicted. Method 500 may be performed by any suitable apparatus or system, such as fan control subsystem 300 (see FIG. 3). It is noted that certain operations described in method 500 may be optional or may be rearranged in different embodiments.

Method 500 may begin at step 502 by determining a first fan importance factor of a first fan associated with a first thermal region of an information handling system. The first fan importance factor may be received from a user of the information handling system or may be computed automatically. The first fan importance factor may be based on a presence of one or more thermal components in a thermal region of the information handling system associated with the first fan. For example, a fan associated with a thermal region having many thermal components may have a relatively high fan importance factor while a fan associated with a thermal region having few thermal components may have a relatively low fan importance factor. The first fan importance factor may also be based on thermal priority ratings of each of the one or more thermal components in the thermal region. For example, a fan associated with a thermal region having components with high thermal priority ratings may have a relatively high fan importance factor while a fan associated with a thermal region having components with low thermal priority ratings may have a relatively low fan importance factor. Determining the first fan importance factor may be performed in accordance with the examples given above in relation to FIGS. 4A, 4B, and 4C.

At step 504, method 500 may determine a second fan importance factor of a second fan associated with a second thermal region of an information handling system. As with the first fan importance factor, the second fan importance factor may be received from a user of the information handling system or may be computed automatically. The second fan importance factor may be based on a presence of one or more thermal components in a thermal region of the information handling system associated with the second fan. The second fan importance factor may also be based on thermal priority ratings of each of the one or more thermal components in the thermal region. Determining the second fan importance factor may be performed in accordance with the examples given above in relation to FIGS. 4A, 4B, and 4C.

At step 506, method 500 may detect a failure of the first fan. As described above in relation to FIG. 4C, the fan failure may occur due to various circumstances and may be detrimental to operations and/or performance of the information handling system for various reasons. The detection of the failure of the first fan may be performed in any suitable way, as described above. For example, the fan failure may be automatically detected by the presence or absence of a communication with the failed fan. In other examples, a user of the information handling system may provide input indicative of the fan failure.

In response to detecting the failure of the first fan at step 506, method 500 may proceed to step 508. At step 508, method 500 may regulate airflow based on the first fan importance factor, based on the second fan importance factor, or based on a combination of both fan importance factors. Regulating the airflow based on the fan importance factors determined at steps 502 and/or 504 may be performed in any suitable way. For example, several embodiments for regulating the airflow in the information handling system based on fan importance factors are described above in relation to FIG. 4C. In certain embodiments, a user of the information handling system may be directed to swap the first fan (i.e., the failed fan) with the second fan (i.e. an operational fan) based on the fan importance factors of both the first fan and the second fan. This embodiment is described in more detail above. In the same or other embodiments, the airflow in the information handling system may be regulated by increasing the fan speed of the second fan (i.e. an operational fan) based on the fan importance factor of the first fan (i.e. the failed fan). This embodiment is described in more detail above. In the same or other embodiments, a nominal volumetric airflow associated with cooling the information handling system when all fans are operational is determined. The airflow in the information handling system may be regulated by automatically increasing the fan speed of the second fan (i.e. an operational fan) according to the fan importance factor of the second fan as long as an actual volumetric airflow is less than the nominal volumetric airflow. This embodiment is described in more detail above. In the same or other embodiments, the airflow of the information handling system may be regulated by directing that a thermal characteristic of the thermal region associated with the first fan (i.e. the failed fan) be altered based on the first fan importance factor and/or the second fan importance factor. This embodiment is described in more detail above. After regulating the airflow in the information handling system, method 500 may end.

As disclosed herein, a fan control subsystem may control a plurality of fans in an information handling system to cool the information handling system. The fan control subsystem may determine a fan importance factor for each of the plurality of fans based on the presence and thermal priority ratings of one or more thermal components located in a respective thermal region associated with each of the plurality of fans. Upon detecting a failure of one of the plurality of fans, the fan control subsystem may regulate airflow within the information handling system based on the fan importance factors determined for the fans.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method for regulating airflow in an information handling system, comprising:
   determining a first fan importance factor of a first fan of the information handling system, the first fan importance factor being indicative of a relative importance of the first fan in cooling the information handling system as compared to a second fan;
   determining a second fan importance factor of the second fan of the information handling system, the second fan importance factor being indicative of a relative importance of the second fan in cooling the information handling system as compared to the first fan;
   detecting, by a fan control subsystem, a failure of the first fan; and
   regulating, by the fan control subsystem in response to detecting the failure of the first fan, airflow in the information handling system based on at least one of the first fan importance factor and the second fan importance factor;
   wherein: determining the first fan importance factor comprises computing the first fan importance factor dependent on a first thermal priority rating indicative of a priority of cooling a first thermal component of the information handling system that is cooled, at least in part, by the first fan;
   determining the second fan importance factor comprises computing the second fan importance factor dependent on a second thermal priority rating indicative of a priority of cooling a second thermal component of the information handling system that is cooled, at least in part, by the second fan.

2. The method of claim 1, wherein:
   the first fan is associated with a first thermal region of the information handling system;
   the second fan is associated with a second thermal region of the information handling system;
   computing the first fan importance factor is further dependent on information indicative of the presence of the first thermal component in the first thermal region;
   computing the second fan importance factor is further dependent on information indicative of the presence of the second thermal component in the second thermal region.

3. The method of claim 1, wherein:
   the first fan is associated with a first thermal region of the information handling system;
   the second fan is associated with a second thermal region of the information handling system;
   regulating the airflow in the information handling system comprises:
      determining, dependent on the first fan importance factor and the second fan importance factor, that a thermal characteristic of the first thermal region is to be altered;
      directing that the thermal characteristic of the first thermal region be altered;
   directing that the thermal characteristic of the first thermal region be altered comprises at least one of:
      directing a user to swap the first fan with the second fan;
      directing a user to remove a first thermal component from the first thermal region; and
      directing a user to swap a first thermal component in the first thermal region with a second thermal component in the second thermal region.

4. The method of claim 1, wherein regulating the airflow in the information handling system comprises:
automatically increasing a fan speed of the second fan by an amount based on the first fan importance factor;
automatically increasing a fan speed of the second fan by an amount based on the second fan importance factor; or
automatically decreasing a power consumption of a first thermal component of the information handling system that is cooled, at least in part, by the first fan.

5. The method of claim 1, wherein:
determining the first fan importance factor comprises retrieving the first fan importance factor from a memory, the first fan importance factor having been previously computed dependent on a first thermal priority rating indicative of a priority of cooling a first thermal component of the information handling system that is cooled, at least in part, by the first fan;
determining the second fan importance factor comprises retrieving the second fan importance factor from a memory, the second fan importance factor having been previously computed dependent on a second thermal priority rating indicative of a priority of cooling a second thermal component of the information handling system that is cooled, at least in part, by the second fan.

6. The method of claim 1, wherein the information handling system comprises the fan control subsystem.

7. An article of manufacture, comprising:
a non-transitory machine-readable medium; and
instructions stored on the non-transitory machine-readable medium that, when read and executed by a processor, cause the processor to:
determine a first fan importance factor of a first fan of an information handling system, the first fan importance factor being indicative of a relative importance of the first fan in cooling the information handling system as compared to a second fan;
determine a second fan importance factor of the second fan of the information handling system, the second fan importance factor being indicative of a relative importance of the second fan in cooling the information handling system as compared to the first fan;
detect a failure of the first fan; and
regulate, in response to detecting the failure of the first fan, airflow in the information handling system based on at least one of the first fan importance factor and the second fan importance factor;
wherein: to determine the first fan importance factor, the instructions further cause the processor to compute the first fan importance factor dependent on a first thermal priority rating indicative of a priority of cooling a first thermal component of the information handling system that is cooled, at least in part, by the first fan;
to determine the second fan importance factor, the instructions further cause the processor to compute the second fan importance factor dependent on a second thermal priority rating indicative of a priority of cooling a second thermal component of the information handling system that is cooled, at least in part, by the second fan.

8. The article of claim 7, wherein:
the first fan is associated with a first thermal region of the information handling system;
the second fan is associated with a second thermal region of the information handling system;
computation of the first fan importance factor is further dependent on information indicative of the presence of the first thermal component in the first thermal region;
computation of the second fan importance factor is further dependent on information indicative of the presence of the second thermal component in the second thermal region.

9. The article of claim 7, wherein:
the first fan is associated with a first thermal region of the information handling system;
the second fan is associated with a second thermal region of the information handling system;
to regulate the airflow in the information handling system, the instructions further cause the processor to:
determine, dependent on the first fan importance factor and the second fan importance factor, that a thermal characteristic of the first thermal region is to be altered;
direct that the thermal characteristic of the first thermal region be altered;
to direct that the thermal characteristic of the first thermal region be altered, the instructions further cause the processor to:
direct a user to swap the first fan with the second fan;
direct a user to remove a first thermal component from the first thermal region; or
direct a user to swap a first thermal component in the first thermal region with a second thermal component in the second thermal region.

10. The article of claim 7, wherein to regulate the airflow in the information handling system, the instructions further cause the processor to:
automatically increase a fan speed of the second fan by an amount based on the first fan importance factor;
automatically increase a fan speed of the second fan by an amount based on the second fan importance factor; or
automatically decrease a power consumption of a first thermal component of the information handling system that is cooled, at least in part, by the first fan.

11. The article of claim 7, wherein:
to determine the first fan importance factor, the instructions further cause the processor to retrieve the first fan importance factor from a memory, the first fan importance factor having been previously computed dependent on a first thermal priority rating indicative of a priority of cooling a first thermal component of the information handling system that is cooled, at least in part, by the first fan;
to determine the second fan importance factor, the instructions further cause the processor to retrieve the second fan importance factor from a memory, the second fan importance factor having been previously computed dependent on a second thermal priority rating indicative of a priority of cooling a second thermal component of the information handling system that is cooled, at least in part, by the second fan.

12. The article of claim 7, wherein the information handling system comprises the processor.

13. An information handling system, comprising:
a first fan configured to cool a first thermal component of the information handling system;
a second fan configured to cool a second thermal component of the information handling system;
a processor; and
a non-transitory machine-readable medium comprising instructions that, when read and executed by the processor, cause the processor to:
determine a first fan importance factor of a first fan of an information handling system, the first fan importance factor being indicative of a relative importance of the first fan in cooling the information handling system as compared to a second fan;

determine a second fan importance factor of the second fan of the information handling system, the second fan importance factor being indicative of a relative importance of the second fan in cooling the information handling system as compared to the first fan;

detect a failure of the first fan; and regulate, in response to detecting the failure of the first fan, airflow in the information handling system based on at least one of the first fan importance factor and the second fan importance factor;

wherein: to determine the first fan importance factor, the instructions further cause the processor to compute the first fan importance factor dependent on a first thermal priority rating indicative of a priority of cooling the first thermal component of the information handling system;

to determine the second fan importance factor, the instructions further cause the processor to compute the second fan importance factor dependent on a second thermal priority rating indicative of a priority of cooling the second thermal component of the information handling system.

14. The information handling system of claim 13, wherein:

the first fan is associated with a first thermal region of the information handling system;

the second fan is associated with a second thermal region of the information handling system;

computation of the first fan importance factor is further dependent on information indicative of the presence of the first thermal component in the first thermal region;

computation of the second fan importance factor is further dependent on information indicative of the presence of the second thermal component in the second thermal region.

15. The information handling system of claim 13, wherein:

the first fan is associated with a first thermal region of the information handling system;

the second fan is associated with a second thermal region of the information handling system;

to regulate the airflow in the information handling system, the instructions further cause the processor to:
determine, dependent on the first fan importance factor and the second fan importance factor, that a thermal characteristic of the first thermal region is to be altered;
direct that the thermal characteristic of the first thermal region be altered;

to direct that the thermal characteristic of the first thermal region be altered, the instructions further cause the processor to:
direct a user to swap the first fan with the second fan;
direct a user to remove the first thermal component from the first thermal region; or
direct a user to swap the first thermal component in the first thermal region with the second thermal component in the second thermal region.

16. The information handling system of claim 13, wherein to regulate the airflow in the information handling system, the instructions further cause the processor to:
automatically increase a fan speed of the second fan by an amount based on the first fan importance factor;
automatically increase a fan speed of the second fan by an amount based on the second fan importance factor; or
automatically decrease a power consumption of the first thermal component of the information handling system.

17. The information handling system of claim 13, wherein:
to determine the first fan importance factor, the instructions further cause the processor to retrieve the first fan importance factor from a memory, the first fan importance factor having been previously computed dependent on a first thermal priority rating indicative of a priority of cooling a first thermal component of the information handling system that is cooled, at least in part, by the first fan;
to determine the second fan importance factor, the instructions further cause the processor to retrieve the second fan importance factor from a memory, the second fan importance factor having been previously computed dependent on a second thermal priority rating indicative of a priority of cooling a second thermal component of the information handling system that is cooled, at least in part, by the second fan.

* * * * *